United States Patent [19]

Fujii et al.

[11] Patent Number: 4,637,130

[45] Date of Patent: * Jan. 20, 1987

[54] METHOD FOR MANUFACTURING A PLASTIC ENCAPSULATED SEMICONDUCTOR DEVICE AND A LEAD FRAME THEREFOR

[75] Inventors: Hiroyuki Fujii, Osaka; Kenichi Tateno, Shiga; Mikio Nishikawa, Kyoto, all of Japan

[73] Assignee: Matsushita Electronics Corporation, Osaka, Japan

[ * ] Notice: The portion of the term of this patent subsequent to Jun. 5, 2001 has been disclaimed.

[21] Appl. No.: 692,385

[22] Filed: Jan. 17, 1985

Related U.S. Application Data

[62] Division of Ser. No. 352,119, Feb. 25, 1982, Pat. No. 4,507,675.

[30] Foreign Application Priority Data

Mar. 5, 1981 [JP] Japan ................................. 56-32229

[51] Int. Cl.⁴ ........................................... H01L 21/56
[52] U.S. Cl. ....................................... 29/588; 29/591; 29/576 S; 357/70
[58] Field of Search ...................... 29/588, 576 S, 590, 29/591; 264/272.17; 357/70

[56] References Cited

U.S. PATENT DOCUMENTS

| 4,451,973 | 6/1985 | Tateno et al. | 29/588 |
| 4,507,675 | 3/1985 | Fujii et al. | 357/70 |

FOREIGN PATENT DOCUMENTS

| EP59926 | 9/1982 | European Pat. Off. | 29/588 |
| EP63811 | 11/1982 | European Pat. Off. | 29/588 |
| 143538 | 8/1983 | Japan | 29/588 |
| 151035 | 9/1983 | Japan | 29/588 |
| 19334 | 1/1984 | Japan | 29/588 |
| 63736 | 4/1984 | Japan | 29/588 |
| 66128 | 4/1985 | Japan | 29/588 |

*Primary Examiner*—Brian E. Hearn
*Assistant Examiner*—Tuan Quach
*Attorney, Agent, or Firm*—Burgess, Ryan & Wayne

[57] ABSTRACT

A method for manufacturing a plastic encapsulated semiconductor device and a lead frame therefor. An external lead of a lead frame extends to one side of a substrate support serving as a heat sink and supporting a semiconductor substrate, and strips of the lead frame extend to the other end of the substrate support. The external lead and strips are clamped by upper and lower molds for plastic encapsulation so that a thin film of plastic is uniformly formed on a lower surface of the substrate support. A connecting portion between the external lead and a connecting band and the strips extending from a plastic encapsulating housing to the outside are cut.

5 Claims, 9 Drawing Figures

METHOD FOR MANUFACTURING A PLASTIC ENCAPSULATED SEMICONDUCTOR DEVICE AND A LEAD FRAME THEREFOR

This is a division of application Ser. No. 352,119, filed Feb. 25, 1982, now U.S. Pat. No. 4,507,675.

BACKGROUND OF THE INVENTION

I. Field of the Invention

The present invention relates to a method for manufacturing a plastic encapsulated semiconductor device which can be used with relatively large power and a lead frame therefor.

II. Description of the Prior Art

Plastic encapsulated semiconductor devices are superior to metal encapsulated semiconductor devices in ease of mass production and manufacturing costs. However, the plastic encapsulated semiconductor devices are inferior to the metal encapsulated semiconductor devices in radiation of heat when they are operated. Plastic encapsulation of semiconductor devices has recently been developed. A high power transistor manufactured by plastic encapsulation has been proposed. In this case, sufficient consideration is taken to allow the radiation of heat.

In a transistor adhered on a metal substrate support and encapsulated by plastic, for example, the lower surface of the substrate support is not covered with plastic but exposed. The substrate support is mounted on a radiator to radiate heat. However, in this case, the substrate support must be electrically insulated from the radiator. The assembly operation of the semiconductor device on the radiator through an insulating plate is complicated and cumbersome.

On the other hand, a plastic encapsulated power transistor is proposed wherein a thin plastic layer is formed on the lower surface of the substrate support during plastic encapsulation and an insulating plate is not required for mounting the power transistor on the radiator. However, in this case, at the time of plastic encapsulation, only the side of the lead frame from which extend the external lead is clamped by the upper and lower molds with a transistor assembly which has the external lead on one side. Plastic is injected while the substrate support is floating in a cavity defined by the molds. Thus, the substrate support may be bent in the cavity due to the injection pressure of the plastic. As a result, it is very difficult to encapsulate in plastic while keeping the substrate support in a proper position, thus, resulting in non-uniformity in the thickness of the plastic layer on the lower surface of the substrate support and degrading radiation characteristics.

SUMMARY OF THE INVENTION

It is an object of the present invention to provide a method for manufacturing a plastic encapsulated semiconductor device and a lead frame therefore wherein, in manufacturing a plastic encapsulated semiconductor device of a structure which has a thin plastic layer on one surface of a substrate support which also serving as a heat sink, to the other surface of which a semiconductor substrate is adhered, the thickness of the thin plastic layer is uniformly formed and with high precision.

In order to achieve the above object of the present invention, there is provided a method for manufacturing a plastic encapsulated semiconductor device and a lead frame therefor wherein a semiconductor device assembly is formed, using a lead frame an external lead of which extends to one side of a substrate support serving as a heat sink and supporting a semiconductor substrate, and strips of which extend to the other end of the substrate support; the external lead and strips are clamped by upper and lower molds for plastic encapsulation; and a connecting portion between the external lead and a connecting band and the strips extending from a plastic encapsulating housing to the outside are cut. Thus, the plastic layer of a desired thickness is formed and with high precision.

The above and other objects and features of the present invention will become apparent from the following detailed description of the preferred embodiments when taken in conjunction with reference to the accompanying drawings.

DETAILED DESCRIPTION OF THE PRIOR ART

Figure 1:
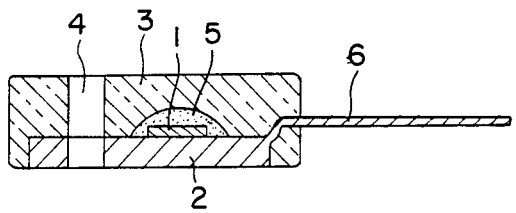
FIGS. 1 and 2 are sectional views showing the structures of conventional plastic encapsulated power transistors, respectively.

FIG. 1 is a sectional view of a conventional power transistor of the plastic encapsulated structure. The lower surface of a substrate support 2 on which a transistor element 1 is adhered is not covered with a plastic encapsulating housing 3 but exposed. A through hole 4 is formed for mounting the power transistor on the radiator with a screw. Reference numeral 5 denotes a protective plastic portion and reference numeral 6 denotes an external lead. When the plastic encapsulated power transistor with the above structure is to be mounted on the radiator (not shown), the exposed lower surface of the substrate support 2 must be thermally coupled with the radiator but must be electrically insulated therefrom. This electrical insulation may be performed by insertion of an insulating plate such as a mica plate.

With the above structure, the heat radiation effect is guaranteed. However, the insulating plate must be inserted between the radiator and the substrate support when the substrate support is to be mounted on the radiator, resulting in a complicated packaging operation. Furthermore, the insulating plate must be properly inserted between the radiator and the substrate support. When the insulating plate, the radiator and the substrate support are to be integrally adhered, they may be misaligned. Thus, electrical insulation cannot be guaranteed. Therefore, as shown in FIG. 2, a plastic encapsulated power transistor is proposed wherein a thin plastic layer 7 is formed on the lower surface of the substrate support 2 and the insulating plate is not required.

Figure 2:
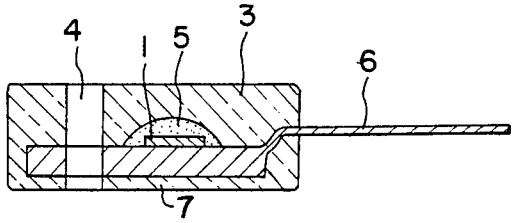
Figure 3:
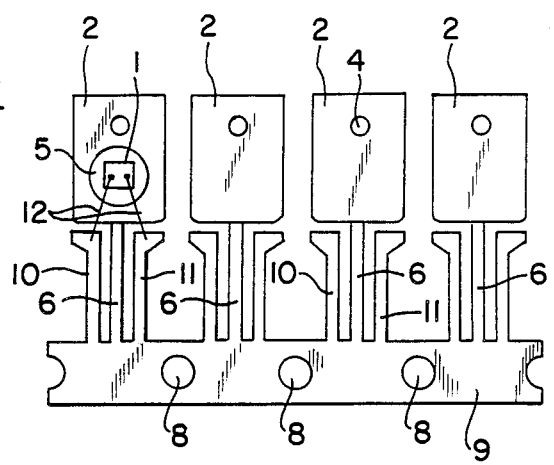
FIG. 3 is a plan view of a conventional lead frame.

FIG. 3 is a plan view of a lead frame which is conventionally used for packaging the plastic encapsulated power transistor of FIGS. 1 and 2. External leads 6, 10 and 11 of the power transistor extend in one direction from a connecting band 9 on which apertures 8 for determining the feed pitch and positioning the substrate support 2 at the time of plastic encapsulation are formed. As shown in FIG. 3, the substrate support 2 is connected to the end of the external lead 6. As shown in the leftmost transistor, the transistor is packaged in such a manner that the transistor element 1 is adhered, metal wires 12 are connected between the external leads 10 and 11 and electrodes of the transistor element 1 corresponding thereto, and a protective plastic portion 5 is formed.

Figure 4:
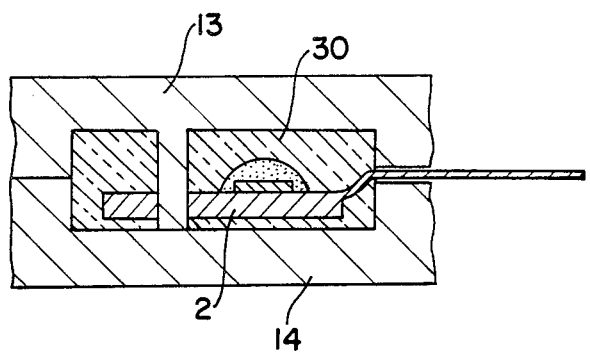
FIG. 4 is a view illustrating the state of plastic encapsulation for forming the plastic encapsulated power transistor of FIG. 2 using the lead frame of FIG. 3.

A transistor assembly is obtained, using the lead frame as described above. This transistor assembly is formed into a plastic encapsulated structure shown in FIG. 2 in the following manner. As shown in FIG. 4, the substrate support 2 of the transistor assembly is floated in a cavity formed between an upper mold 13 and a lower mold 14. Plastic 30 is then injected into the cavity. The plastic 30 is also filled in the cavity immediately under the lower surface of the substrate support 2. Thus, the plastic encapsulated semiconductor device of FIG. 2 is manufactured.

As is apparent from FIG. 4, when the plastic encapsulated structure of FIG. 2 is to be obtained by using the lead frame of FIG. 3, plastic is injected into the cavity while only the side on which the external leads are formed is clamped between the upper and lower molds. The substrate support 2 may be bent within the cavity due to the injection pressure of plastic. Therefore, it is very difficult to dispose the substrate support 2 in a proper position. If the substrate support 2 is bent, the uniform thickness of the thin plastic layer 7 is not obtained. Further, this non-uniformity in thickness directly results in degradation of radiation characteristics.

DESCRIPTION OF THE PREFERRED EMBODIMENTS

Figure 5A:
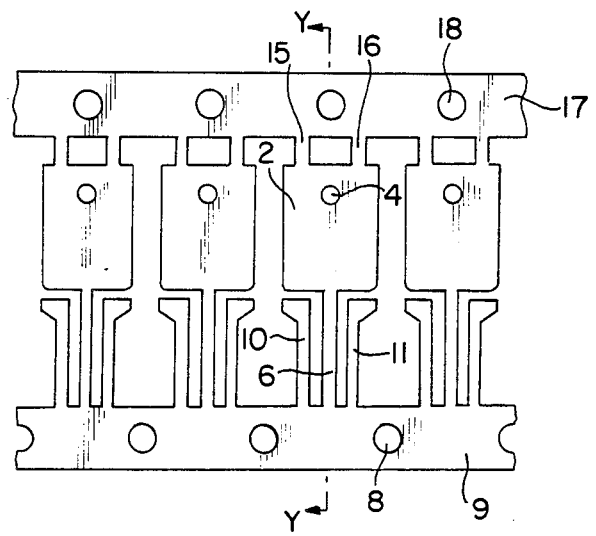
FIGS. 5A and 5B are a plan view and a sectional view respectively, of a lead frame according to one embodiment of the present invention.
Figure 5B:
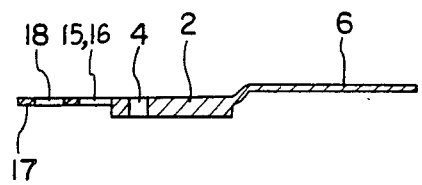

FIGS. 5A and 5B are views illustrating the structure of a lead frame according to the present invention in which FIG. 5A is a plan view thereof and FIG. 5B is a sectional view thereof along the line Y—Y.

Two strips 15 and 16 extend from a side of the substrate support 2 which opposes the side to which the external lead 6 is connected. The strips 15 and 16 are connected to a second connecting band 17. Apertures 18 formed on the second connecting band 17 serve to fit with part of a mold for alignment in the plastic encapsulation process. As shown in FIG. 5B, the thickness of the strips 15 and 16 is smaller than that of the substrate support 2. A predetermined step is formed between the lower surfaces of the strips 15 and 16 and the lower surface of the substrate support 2.

Figure 6:
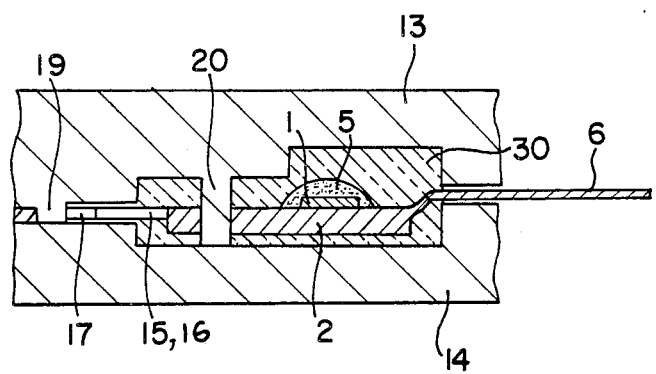
FIGS. 6, 7 and 8 are views illustrating the plastic encapsulation process to the completion of manufacture according to a method for manufacturing the plastic encapsulated semiconductor device of the present invention.

FIG. 6 is a view illustrating the state of plastic encapsulation of the transistor assembly formed by using the lead frame according to the present invention. The plastic 30 is injected into the cavity formed between the upper and lower molds 13 and 14 in the same manner as in the conventional plastic encapsulation. However, when the lead frame according to the present invention is used, as shown in the figure, the external lead 6 of the lead frame is clamped by the upper and lower molds 13 and 14 on one side. At the same time, the strips 15 and 16 and the second connecting band 17 are clamped by the upper and lower molds 13 and 14 on the other side. Projections (not shown) of the upper mold 13 fit in the apertures 8 formed in the first connecting band 9. Simultaneously, projections 19 of the upper mold 13 fit in the aperture 18 of the second connecting band 17. Reference numeral 20 denotes a projection of the upper mold 13 which forms a through hole for mounting the semiconductor device to a radiator with a screw.

According to the present invention, the substrate support 2 of the lead frame is supported by the external lead 6 and the strips 15 and 16 which are clamped by the upper and lower molds 13 and 14, and thus floats in the cavity of the molds. The first and second connecting bands 9 and 17 are clamped by the upper and lower molds 13 and 14, as described above. Further, since the projections of the upper mold 13 are fitted in the apertures formed in the first and second connecting bands 9 and 17, the first and second bands 9 and 17 are not allowed to move horizontally. Thus, the floating condition of the substrate support 2 is properly controlled.

Figure 7:
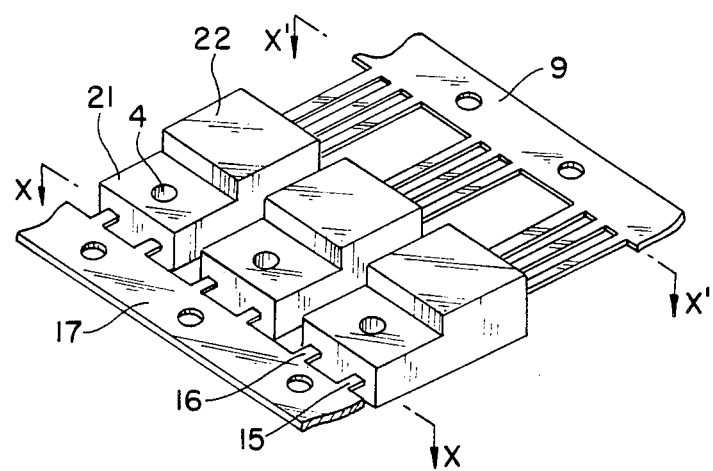

FIG. 7 is a perspective view illustrating the condition after the plastic encapsulation is completed. As shown in the figure, the plastic encapsulating housing has a thin portion 21 in which the through hole 4 for a screw is disposed and a thick portion 22. A step is formed between the thin portion 21 and the thick portion 22, so that the head of the screw does not extend upward when the transistor is mounted to the radiator.

Figure 8:
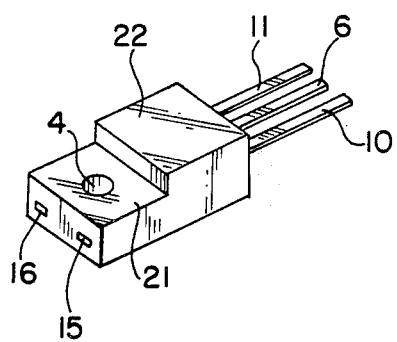

The strips 15 and 16 and the first connecting band 9 are cut along the line X—X and the line X'—X', respectively. Thus, the plastic encapsulated transistor shown in FIG. 8 is manufactured.

In the transistor manufactured according to the method of the present invention, the cut surfaces of the strips 15 and 16 are exposed outside the plastic encapsulating housing. However, as shown in FIG. 5B, since another step is formed between the lower surface of the substrate support 2 and the lower surfaces of the strips 15 and 16, an adequate space is provided between the lower surface of the plastic encapsulating housing which is mounted on the radiator and the cut surfaces of the strips 15 and 16. Therefore, short circuiting does not occur at this portion. Further, since the strips 15 and 16 are thin, they are easily cut.

The plastic for plastic capsulation used according to the method of the present invention preferably has high thermal conductivity. The thickness of the plastic layer immediately under the substrate support is preferably 0.3 to 0.5 mm in consideration of heat radiation and electrical insulation. Within the above range of thickness, better results are obtained.

As is apparent from the above description, a plastic encapsulated semiconductor device which has a thin plastic layer immediately under the substrate support which also serves as the heat sink is manufactured with high precision according to the present invention.

What is claimed is:

1. A method for manufacturing a plastic encapsulated semiconductor device comprising the steps of clamping at least external leads and strips of a semiconductor device assembly formed using a lead frame which has a first connecting band connected to said external leads extending from one side of a substrate support further used as a heat sink and a second connecting band connected to said strips extending from the other side of said substrate support, clamping at least said external leads and said strips by upper and lower molds so that said substrate support may float in a cavity formed by said upper and lower molds, injecting a plastic into the cavity while parts of said strips are disposed in said cavity, and cutting parts of said strips which extend outside a plastic encapsulating housing and cutting a connecting portion between said external leads and said first connecting band.

2. A method according to claim 1, wherein a thickness of the plastic encapsulated below said strips is larger than the thickness of the plastic encapsulated below said substrate support.

3. A method according to claim 1, wherein said cavity formed by said upper and lower molds consists of a first portion and a second portion, a distance between a top and a bottom of said first portion being larger than the distance of the second portion so as to position a semiconductor element mounting portion of said semiconductor device assembly with said first portion.

4. A method according to claim 3, wherein a mold projection for forming a through hole for mounting said semiconductor device to said substrate support with a screw is formed in said second portion.

5. A method according to claim 1, wherein a thickness of the plastic encapsulated under said substrate support is 0.3 to 0.5 mm.

* * * * *